(12) United States Patent
Huang

(10) Patent No.: US 12,224,021 B2
(45) Date of Patent: Feb. 11, 2025

(54) MEMORY DEVICE WITH LEAKAGE CURRENT VERIFYING CIRCUIT FOR MINIMIZING LEAKAGE CURRENT

(71) Applicant: Winbond Electronics Corp., Taichung (TW)

(72) Inventor: Koying Huang, San Jose, CA (US)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 18/469,567

(22) Filed: Sep. 19, 2023

(65) Prior Publication Data
US 2024/0006003 A1   Jan. 4, 2024

Related U.S. Application Data

(62) Division of application No. 17/334,827, filed on May 31, 2021, now Pat. No. 11,798,642.

(51) Int. Cl.
| | |
|---|---|
| *G11C 16/34* | (2006.01) |
| *G11C 16/08* | (2006.01) |
| *G11C 16/16* | (2006.01) |
| *G11C 16/24* | (2006.01) |
| *G11C 29/50* | (2006.01) |
| *G11C 16/28* | (2006.01) |

(52) U.S. Cl.
CPC .......... *G11C 16/3459* (2013.01); *G11C 16/08* (2013.01); *G11C 16/16* (2013.01); *G11C 16/24* (2013.01); *G11C 29/50* (2013.01); *G11C 16/28* (2013.01); *G11C 2029/5006* (2013.01)

(58) Field of Classification Search
None
See application file for complete search history.

(56) References Cited

U.S. PATENT DOCUMENTS

2019/0279732 A1*   9/2019   Huang ................... G11C 29/50

\* cited by examiner

*Primary Examiner* — Alfredo Bermudez Lozada
(74) *Attorney, Agent, or Firm* — JCIPRNET

(57) ABSTRACT

A memory device includes a controller configured for initiating a program operation for a first column of memory cells which belongs to a group of memory cells; setting a verify condition which comprises a leakage current threshold during a leakage current verifying operation; performing, via a leakage current verifying circuit, a leakage current verifying operation for the first column of the memory cells by applying a negative voltage sweep to each of first remaining M−1 unselected WLs of the M WLs until finding a first negative voltage resulting in the first column of the memory cells having passed leakage current threshold; and applying the program operation for the first column of the memory cells by applying the first negative voltage to each of the first remaining M−1 unselected WLs of the M WLs and a positive bit line voltage for the N BLs.

15 Claims, 11 Drawing Sheets

MEMORY DEVICE WITH LEAKAGE CURRENT VERIFYING CIRCUIT FOR MINIMIZING LEAKAGE CURRENT

CROSS REFERENCE TO RELATED APPLICATION

This application is a divisional application and claims the priority benefit of US non-provisional application Ser. No. 17/334,827, filed on May 31, 2021, now pending. The entirety of the above-mentioned patent application is hereby incorporated by reference herein and made a part of specification.

TECHNICAL FIELD

The disclosure is directed to a memory device with a leakage current verifying circuit for minimizing leakage current and a method of minimizing leakage current thereof.

BACKGROUND

Conventionally, a memory device such as a NOR flash memory device may have at least three main operations that can be performed on the memory cells within the NOR flash memory device, and the three operations may include not limited to a read operation, a program operation, and an erase operation. Minimizing leakage currents during these operations could be crucial for improving the performance of the memory device.

A read operation could be performed to determine the state of a cell such as programmed or erased in order to obtain the binary content of a cell. This is typically done by applying a reference threshold voltage (e.g. VTref) to a gate of a transistor (e.g. MOSFET). If the gate of the transistor of the cell conducts current, then the cell could be considered as being in an erased state. On the contrary, if the gate of the transistor of the cell does not conduct current, then the cell could be considered as being in a programmed state. The program operation involves injecting electrons into the gate of the transistor resulting in an increased threshold voltage. If the cell is programmed, it may have to maintain a sufficient level of reference threshold voltage. The erased operation may involve withdrawing the injected electrons from the transistor gate resulting in a decreased reference threshold voltage.

Before programming a NOR flash memory device, an erase operation could be performed on the locations where the programming is to occur, and erase operations are typically performed for an entire block instead of being performed in a per-bit manner. After a program operation, a bit that is in the programmed state may hold a binary 0 value. After an erase operation, a bit that is in the erased state may hold a binary 1 value. However, the problem is that not all the cells would have the same reference threshold voltages which instead would be distributed in a Gaussian like curve. In other words, some cells may have reference threshold voltages that are high, and other cells may have reference threshold voltages that are low. Thus, it could be quite problematic if the distribution of the reference threshold voltages is widened instead of narrowed. During the erase operation, as an entire block is erased, the variations of the threshold voltages may cause certain cells to have threshold voltages close to a low voltage resulting in leakage current.

Further, the process of programming the memory device would incur a tangible amount of programming current which could be contributed from sources such as hot electronic drain current as well as column leakage current of memory cells of the memory device. The column leakage current could be contributed from the sub-threshold current of cells belonging to the same bit line (BL) of a group of memory cells which may belong to the same column during an erase operation, and memory cells of the same column could be connected to the same word line (WL). A program operation may also include a post-program operation. If a column leakage current is considered too high, a post-program operation would eventually attempt to increase the threshold voltage of whichever cells that exhibit high leakage current in order to re-perform the program operation. The column leakage current is too high, it could potentially be detrimental for the memory device, as the high column leakage current would not only result in wastes for the drain pump current during a program operation but would also pull down the BL bias voltage due to having more voltage drop across the BL transistor which is the transistor that turns on or off the BL.

The problem of the above described leakage current would be worsened as die sizes are more and more reduced. The reduced die sizes would then lead to an increase of program current leading to poor programming efficiency of the memory device. Currently, there has been endeavors during a post-program procedure and a verify procedure to address the BL leakage current problem for a read operation but not for a program operation. However, there has not been a reliable solution to minimize leakage current for both a program operation.

SUMMARY OF THE DISCLOSURE

Accordingly, the disclosure is directed to a memory device with a leakage current verifying circuit for minimizing leakage current.

In an aspect, the disclosure is directed to a memory device which includes not limited to a memory array having a group of memory cells which includes M WLs and N BLs as M and N are integers greater than 1, a leakage current verifying circuit for verifying leakage currents of the memory array, and a controller coupled to the memory array and the leakage current verifying circuit. The controller is configured at least to perform an erase operation for a first column of memory cells which belongs to the group of memory cells and is connected to a first WL of the M WLs, set a verify condition which includes a leakage current threshold during a leakage current verifying operation, perform, via the leakage current verifying circuit, the leakage current verifying operation for the first column of the memory cells connected to the first WL of the M WLs by comparing a leakage current of a cell of the first column of the memory cells to the leakage current threshold, detect, via the leakage current verifying circuit, a failure of the first column of the memory cells in response to a cell of the first column of the memory cells having the leakage current being above the leakage current threshold, and perform a post-program operation to repair the failure of the first column of the memory cells.

In another aspect, the disclosure is directed to a memory device which includes not limited to a memory array having a group of memory cells which includes M WLs and N BLs as M and N are integers greater than 1, a leakage current verifying circuit for verifying leakage currents of the memory array, and a controller coupled to the memory array and the leakage current verifying circuit. The controller is configured at least to initiate a program operation for a first column of memory cells which belongs to the group of memory cells and is connected to a first WL of the M WLs, set a verify condition which includes a leakage current threshold during a leakage current verifying operation, perform, via the leakage current verifying circuit, a leakage current verifying operation for the first column of the memory cells by applying a negative voltage sweep to each of first remaining M−1 unselected WLs of the M WLs until finding a first negative voltage resulting in the first column of the memory cells having passed leakage current threshold, and apply the program operation for the first column of the memory cells by applying the first negative voltage to each of the first remaining M−1 unselected WLs of the M WLs and a positive BL voltage for the N BLs.

In order to make the aforementioned features and advantages of the present disclosure comprehensible, exemplary embodiments accompanied with figures are described in detail below. It is to be understood that both the foregoing general description and the following detailed description are exemplary, and are intended to provide further explanation of the disclosure as claimed.

It should be understood, however, that this summary may not contain all of the aspect and embodiments of the present disclosure and is therefore not meant to be limiting or restrictive in any manner. Also, the present disclosure would include improvements and modifications which are obvious to one skilled in the art.

DETAILED DESCRIPTION OF DISCLOSED EMBODIMENTS

The disclosure provides a memory device which has a leakage current verifying circuit for minimizing the leakage current. The disclosure provides a technique which not only utilizes a negative voltage for unselected word lines WLs during a program operation to reduce leakage current but also provides a target for the leakage current level for the program operation due to the current lack of a verifying procedure of the leakage current level for program condition. One of the purposes of the disclosure is to provide a leakage current verifying circuit which verifies the leakage current level and also ensure that the leakage current level is below an acceptable threshold.

The disclosure provides two exemplary embodiments of the leakage current verifying circuit for minimizing leakage current. The first exemplary embodiment would involve perform a post-program verifying procedure not only for a read operation but also for the program operation. The post program procedure may also be included as a part of an erase operation. The second exemplary embodiment would involve adjusting negative voltages for unselected WLs, and the level of the negative voltages being applied would depend on the measured leakage current during a program operation. The technique of the second exemplary embodiment during a program operation would mostly be implemented right before actually programming a cell or a group of cells, and the technique would be repeated again for programming a next data address.

The procedures of the first exemplary embodiment could be performed in the post verify operation and in the post program operation. The procedures may involve setting a post verify target for the negative voltage level of unselected WLs during the program operation. If the leakage current of a cell has been found to be higher than a leakage current threshold, the previously described post program operation could be repeatedly performed until the leakage current of the cell is lower than the leakage current threshold. The procedures of the first exemplary embodiment could be entirely performed during an erase operation and thus would not affect the time of the program operation.

The procedures of the second exemplary embodiment would involve verifying the leakage current of a column of cells before a program operation. Dynamic adjustments of negative voltage levels of for unselected WLs could be performed until the leakage currents of a column of cells pass a leakage current threshold. The dynamic adjustments of the negative voltage levels of for unselected WLs may involve a voltage sweep where the optimal negative voltage level could be applied to unselected WLs during the program operation. It should be noted that if the negative voltage levels are too low, it may cause more drain disturb on unselected cells sharing the same BL.

Figure 1:
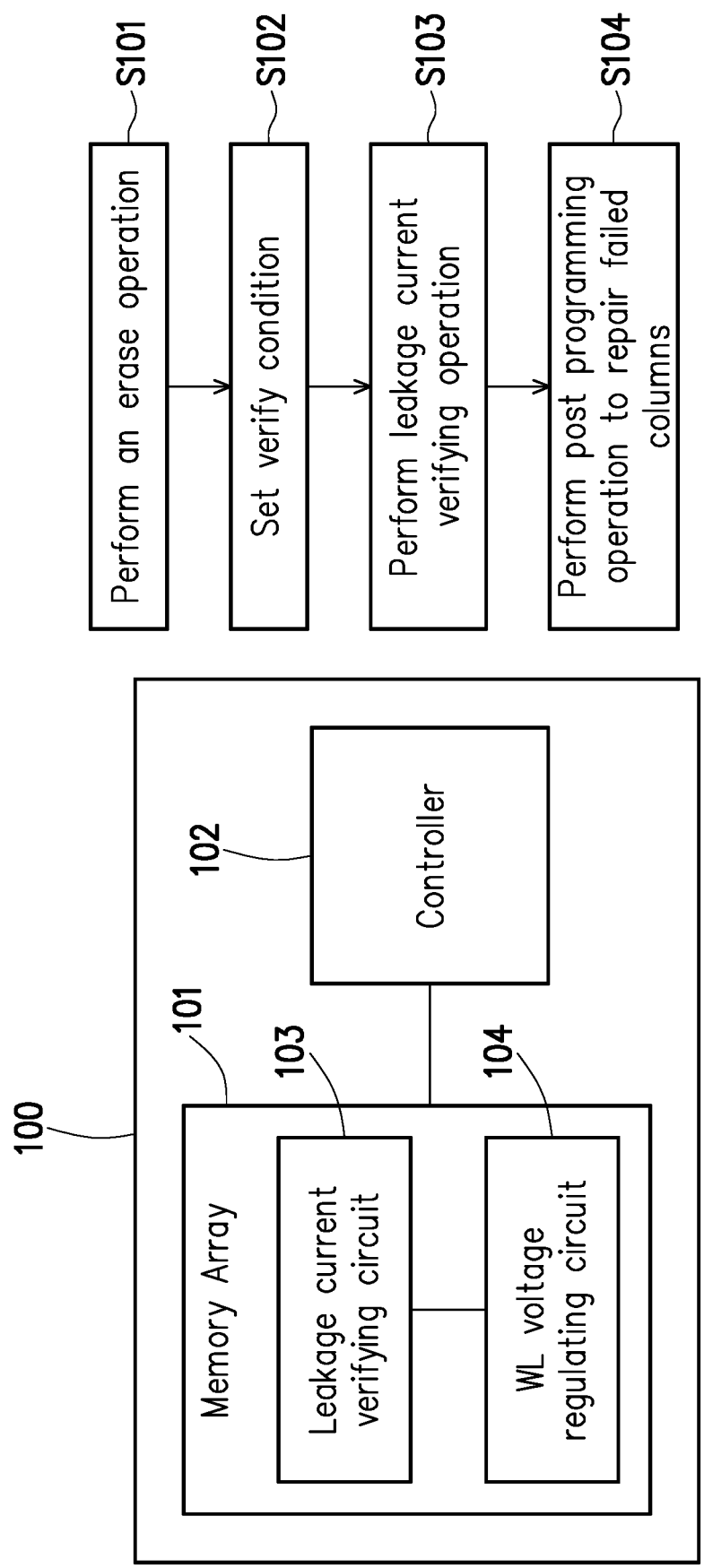
FIGS. 1 and 2 shows block diagrams of a memory device with a leakage current verifying circuit for minimizing leakage current according to a first and second exemplary embodiment of the disclosure respectively.

For the first exemplary embodiment, a block diagram of a memory device with a leakage current verifying circuit for minimizing leakage current is shown in FIG. 1. Referring to FIG. 1, the memory device 100 would include not limited to a memory array 101 having a group of memory cells which includes M WLs and N BLs as M and N are integers greater than 1, a leakage current verifying circuit 103 for verifying leakage currents of the memory array, and a controller 102 coupled to the memory array 101 and the leakage current verifying circuit 103. The controller 102 could be configured to perform an erase operation for a first column of memory cells connected to a first WL of the M WLs (S101). Next, the controller could be configured to set a verify condition which includes a leakage current threshold during a leakage current verifying operation (S102). Further, the controller may perform, via the leakage current verifying circuit 103, the leakage current verifying operation for the first column of the memory cells connected to the first WL by comparing a leakage current of a cell of the first column of the memory cells to the leakage current threshold (S103). Subsequently, the controller may detect, via the leakage current verifying circuit 103, a success or a failure of the first column of the memory cells in response to any cell of the first column of the memory cells having the leakage current being above the leakage current threshold. Moreover, the controller could be configured to perform a post-program operation to repair the failure of the first column of the memory cells (S104). Optionally, the memory array 101 may include a WL voltage regulating circuit 104 connected to the leakage current verifying circuit 103 for regulating the negative voltage(s) of unselected WL(s) in case of voltage fluctuations due to temperature variations or other causes.

Figure 2:
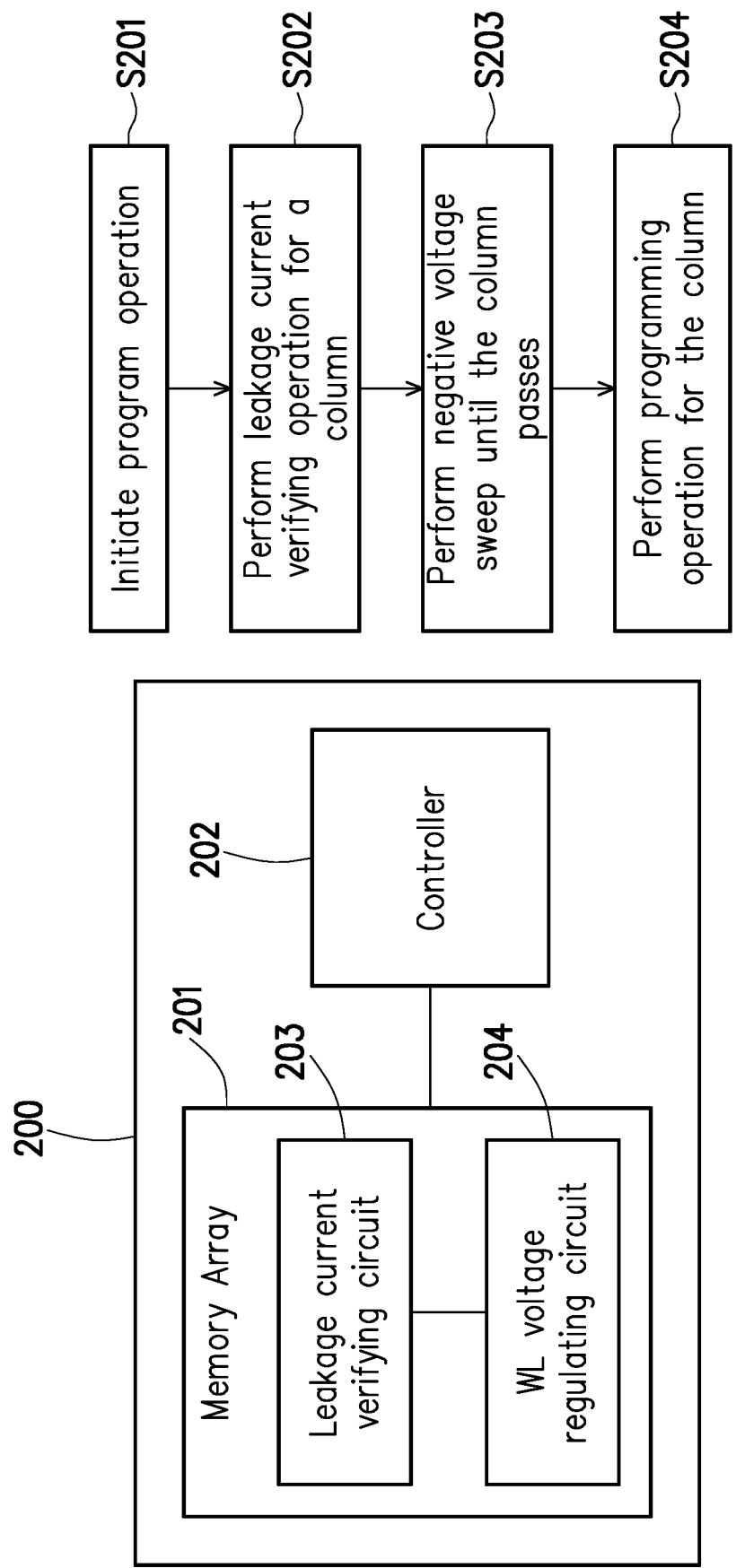

For the second exemplary embodiment, a block diagram of a memory device with a leakage current verifying circuit for minimizing leakage current is shown in FIG. 2. Referring to FIG. 2, the memory device 200 would include not limited to a memory array 201 having a group of memory cells which includes M WLs and N BLs as M and N are integers greater than 1, a leakage current verifying circuit 203 for verifying leakage currents of the memory array, and a controller 202 coupled to the memory array 201 and the leakage current verifying circuit 203. First, the controller 202 could be configured to initiate a program operation for a first column of memory cells connected to a first WL of the M WLs (S101). The controller may also set a verify condition which includes a leakage current threshold during a leakage current verifying operation. Next, the controller 202 may perform, via the leakage current verifying circuit 203, a leakage current verifying operation for the first column of the memory cells (S202) by applying a negative voltage sweep to each of first remaining M−1 unselected WLs of the M WLs until finding a first negative voltage resulting in the first column of the memory cells having passed leakage current threshold (S203). The subsequently, the controller 202 could be configured to apply the program operation for the first column of the memory cells by applying the first negative voltage to each of the first remaining M−1 unselected WLs of the M WLs and a positive BL voltage for the N BLs (S204). Optionally, the memory array 201 may include a WL voltage regulating circuit 204 connected to the leakage current verifying circuit 203 for regulating the negative voltage(s) of unselected WL(s) in case of voltage fluctuations due to temperature variations or other causes.

Figure 3:
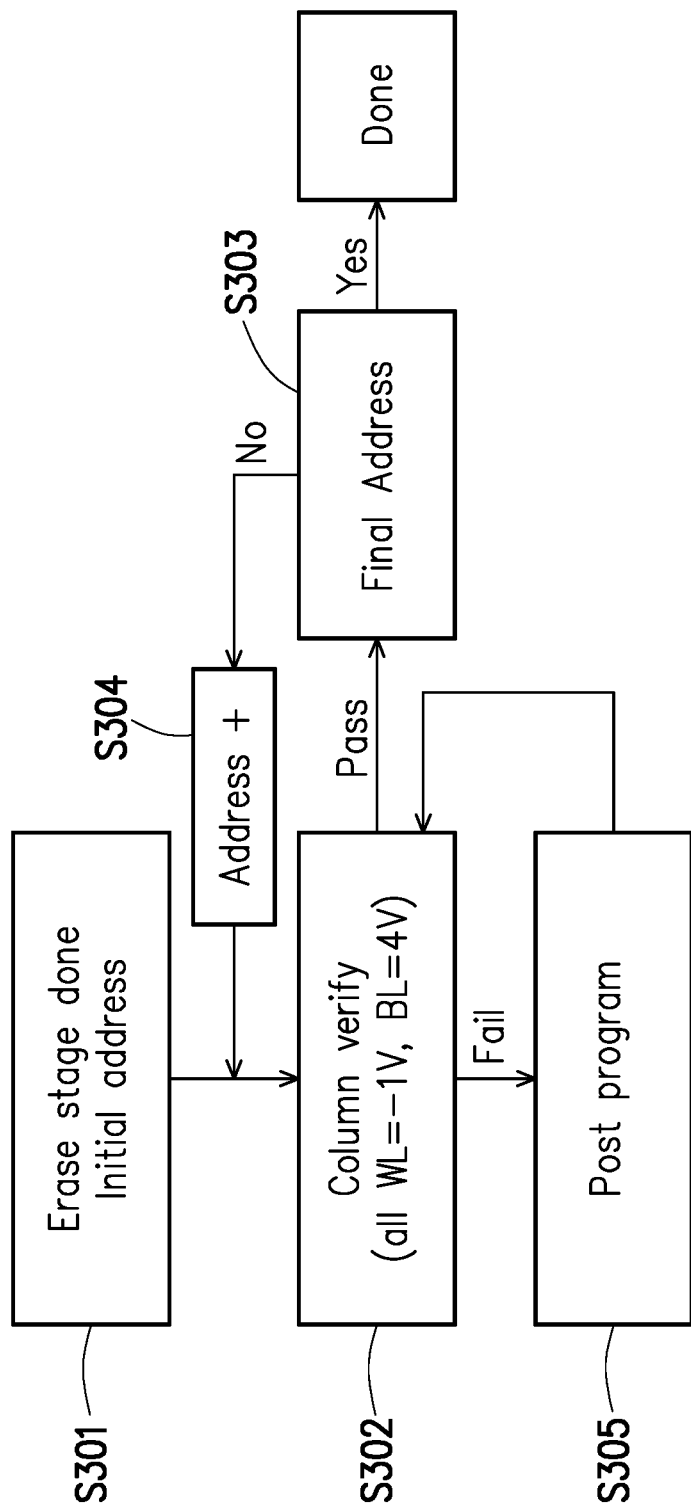
FIGS. 3 and 4 shows flow charts of a method for minimizing a leakage current according to a first and second exemplary embodiment of the disclosure respectively.

The procedures performed for the first exemplary embodiment used by the memory device 100 of FIG. 1 for minimizing a leakage current is shown in the flow chart of FIG. 3. In step S301, a block of memory cells is to be erased, and an erase operation is performed by the first memory device 100 for a first memory location associated with a first address of the block of memory cells. The first memory location could be but not limited to a column of cells so that the erase operation could be performed for a column of cells which could be controlled by the same WL and thus could be selected by activating the WL. In step S302, the memory device 100 may perform a leakage current verifying operation for the first memory location associated with the first address. The leakage current verifying operation could be performed for the column of cells which have been selected for the erase operation and are controlled by the same WL (i.e. selected WL).

While performing the leakage current verifying operation, the first memory device 100 may implement a verifying condition which includes a leakage current threshold, a negative voltage for each of the remaining M−1 unselected WLs (assuming that the block of cells to be erased is controlled by a total of M WLs), and a positive bit line (BL) voltage for the N BLs. The leakage current threshold, could be, for example, 10 micro amp (uA). The negative voltage for each of the remaining M−1 unselected WLs could be, for example, −1 volt (V). The BL voltage could be, for example, 4V.

The first memory device 100 may detect, via a leakage current verifying circuit (e.g. 130), whether the group of memory cells associated with the first address has passed the leakage current verifying operation by comparing the leakage current of a cell of the group of memory cells with the leakage current threshold. In response to each cell of the group of memory cells having a leakage current being below the leakage current threshold, the group of memory cells is considered to have passed the leakage current verifying operation, and the procedures performed for the first exemplary embodiment would continue from step S303. In response to any cell of the group of memory cells having a leakage current being above the leakage current threshold, the group of memory cells is considered to have failed the leakage current verifying operation, and the procedures performed for the first exemplary embodiment would continue from step S305.

In step S303, the memory device 100 would determine whether the first address is the final address. If the first address is the final address, the procedures performed for the first exemplary embodiment would end. If the first address is not the final address, then the address would increment from the first address as the next address. Step S302 would then be repeated for the next address. Essentially, step S302 would be repeated until the erase operation is performed for the entire block of memory cells controlled by the M WLs. In step S305, the post program operation would be performed to repair the group of memory cells that has failed the leakage current verifying operation. The post program operation is currently well known and would essentially involve increasing a threshold voltage of each cells within the group of memory cells until the entire group of memory cells passes the leakage current verifying operation.

Figure 4:
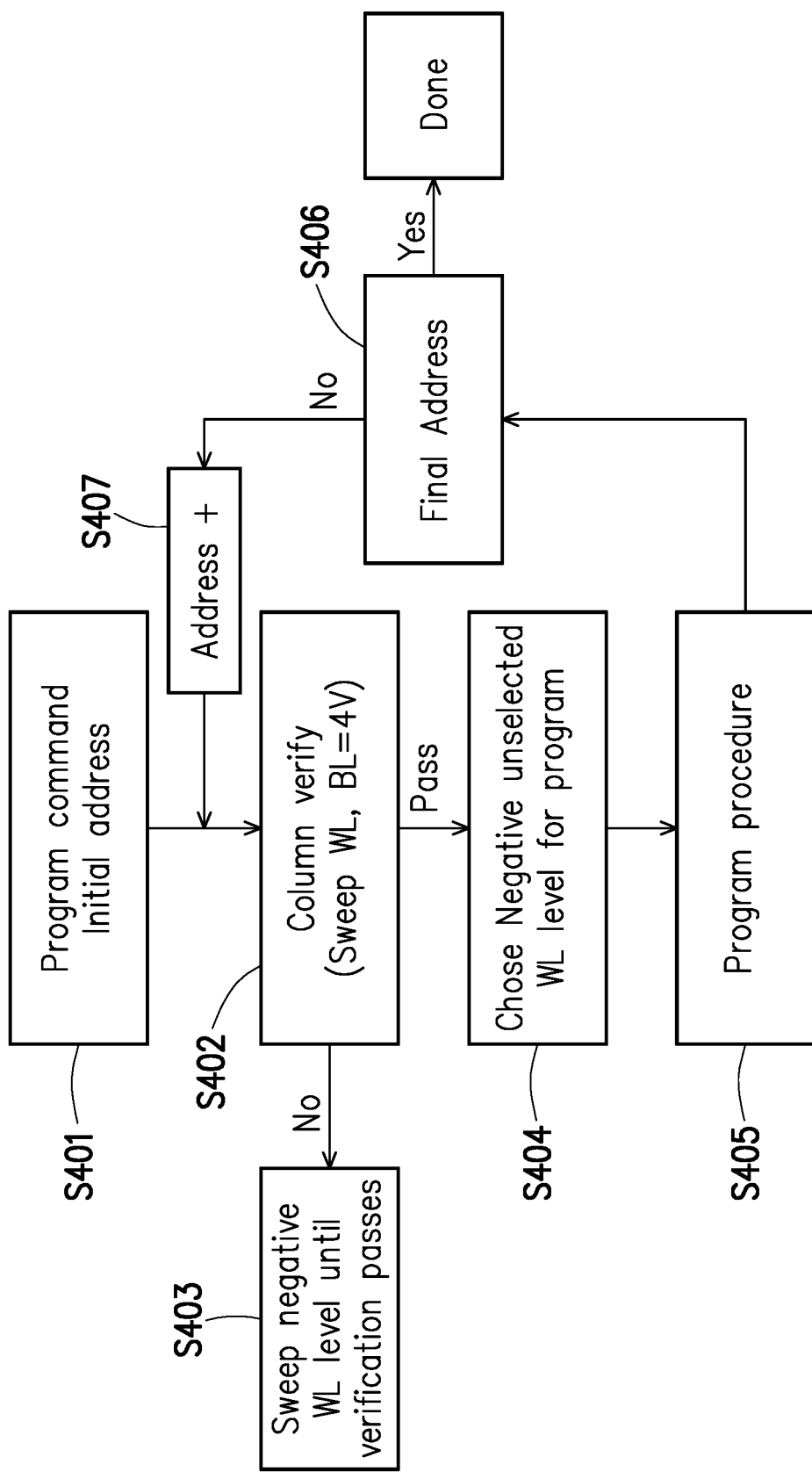

The procedures performed for the second exemplary embodiment used by the memory device 200 of FIG. 2 for minimizing a leakage current is shown in the flow chart of FIG. 4. In step S401, the memory device 200 receives a first address of a group of memory cells is to be programmed and commences the programming operation which is to be carried out at a first memory location corresponding to the first address of the group of memory cells. The first memory location could be but not limited to a first column of cells so that the program operation could be performed for the first column of cells which could be controlled by the same WL and thus could be selected by activating the WL. In step S402, the memory device 200 may perform a leakage current verifying operation for cells of the first column corresponding to the first memory location of the first address. The leakage current verifying operation could be performed one column at a time in a column by column basis, and a selected column could be controlled by the same WL (i.e. selected WL).

While performing the leakage current verifying operation, the first memory device 200 may implement a verifying condition which includes a leakage current threshold, a first negative voltage for each of the remaining M−1 unselected WLs (assuming that the block of cells to be erased is controlled by a total of M WLs), and a positive bit line (BL) voltage for the N BLs. If all cells of the first column have a leakage current below the leakage current threshold (i.e. passes the leakage current verifying operation), then step S404 is performed next. If at least one of the cells of the first column have a leakage current greater than the leakage current threshold (i.e. fails the leakage current verifying operation), then step S403 is performed next. The initial negative voltage for each of the remaining M−1 unselected WLs could be any negative voltage such as −1 volt (V). The BL voltage could be, for example, 4V.

Assuming that the above described first column has failed the leakage current verifying operation, then in step S403, a negative voltage sweep is to be performed for the unselected WLs (i.e. WLs of the group of memory cells to be programmed other than the WL which controls the first column.) The negative voltage sweep is to be explained with further details later on in the written descriptions for FIG. 5. Assuming that during the negative voltage sweep of step S403, a first negative voltage has determined resulting in all the cells of the first column passing the leakage current verifying operation, then in step S404, the first negative voltage is selected for the program operation in step S404. In step S405, the first column would be programmed by applying the first negative voltage to unselected WLs. In step S406, the memory device 200 would determine whether the first address is the final address. If the first address is the final address, the procedures performed for the first exemplary embodiment would end. If the first address is not the final address, then in step S407, the address of the next column would increment from the first address as the next address. Step S402 would then be repeated for the next address. Essentially, step S402 would be repeated until the program operation is performed for the entire group of memory cells to have been programmed.

Figure 5:
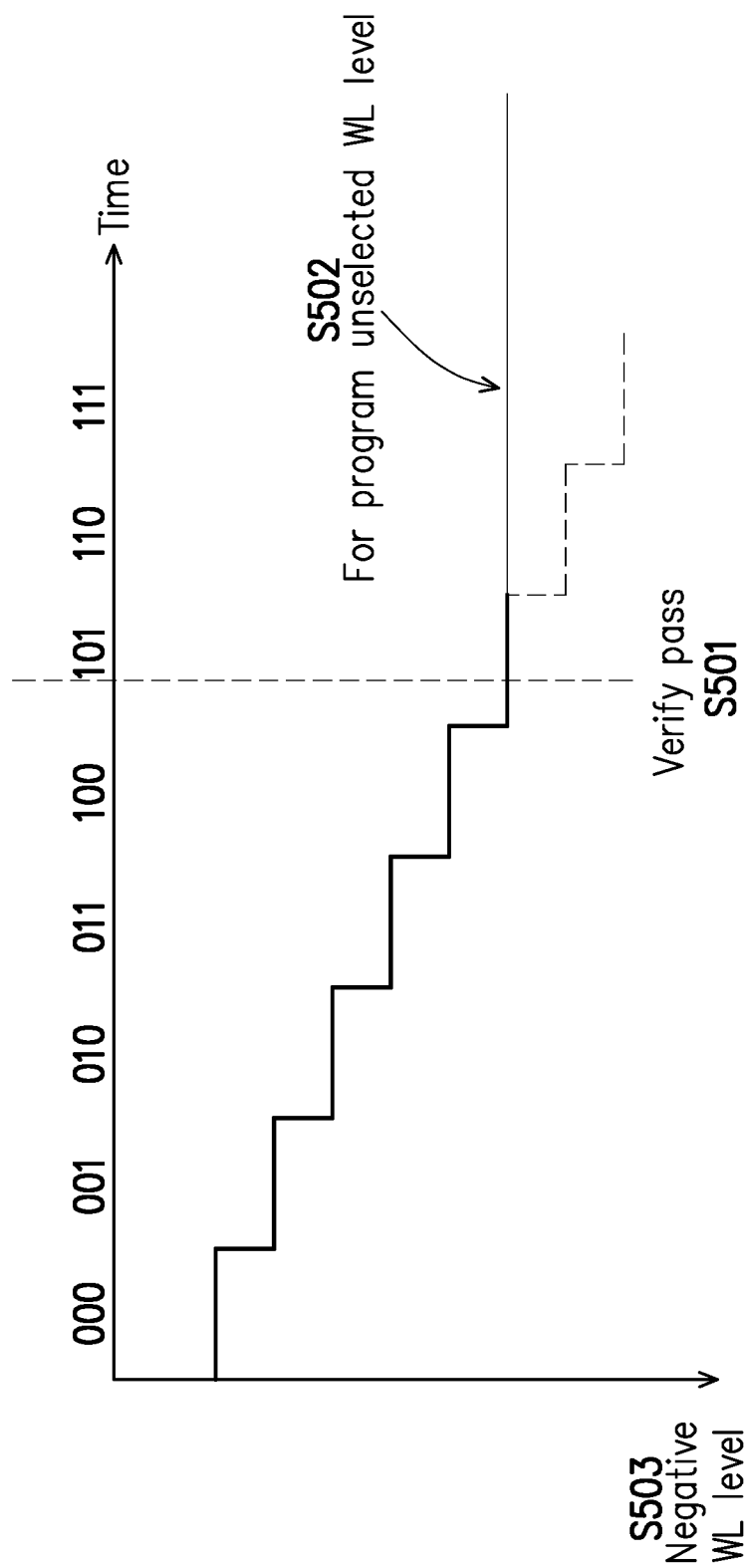
FIG. 5 illustrates negative voltage sweep according to an exemplary embodiment of the disclosure.

For the above described concept of negative voltage sweep, FIG. 5 serves to explain the such concept. The purpose of the negative voltage sweep, is to adjust the negative voltage applied to unselected WLs over time until an adjusted negative voltage is found to have resulted in the selected column of memory cells controlled by a selected WL passing the leakage current verifying operation. Referring to FIG. 5, the negative voltage level of the unselected WL is decreased (S503) until the adjusted negative voltage is found (S501) resulting in the column of memory cells controlled by a selected WL to have passed the leakage current verifying operation. Next, the adjust negative voltage is to be used for programming the selected column of memory cells.

Figure 6:
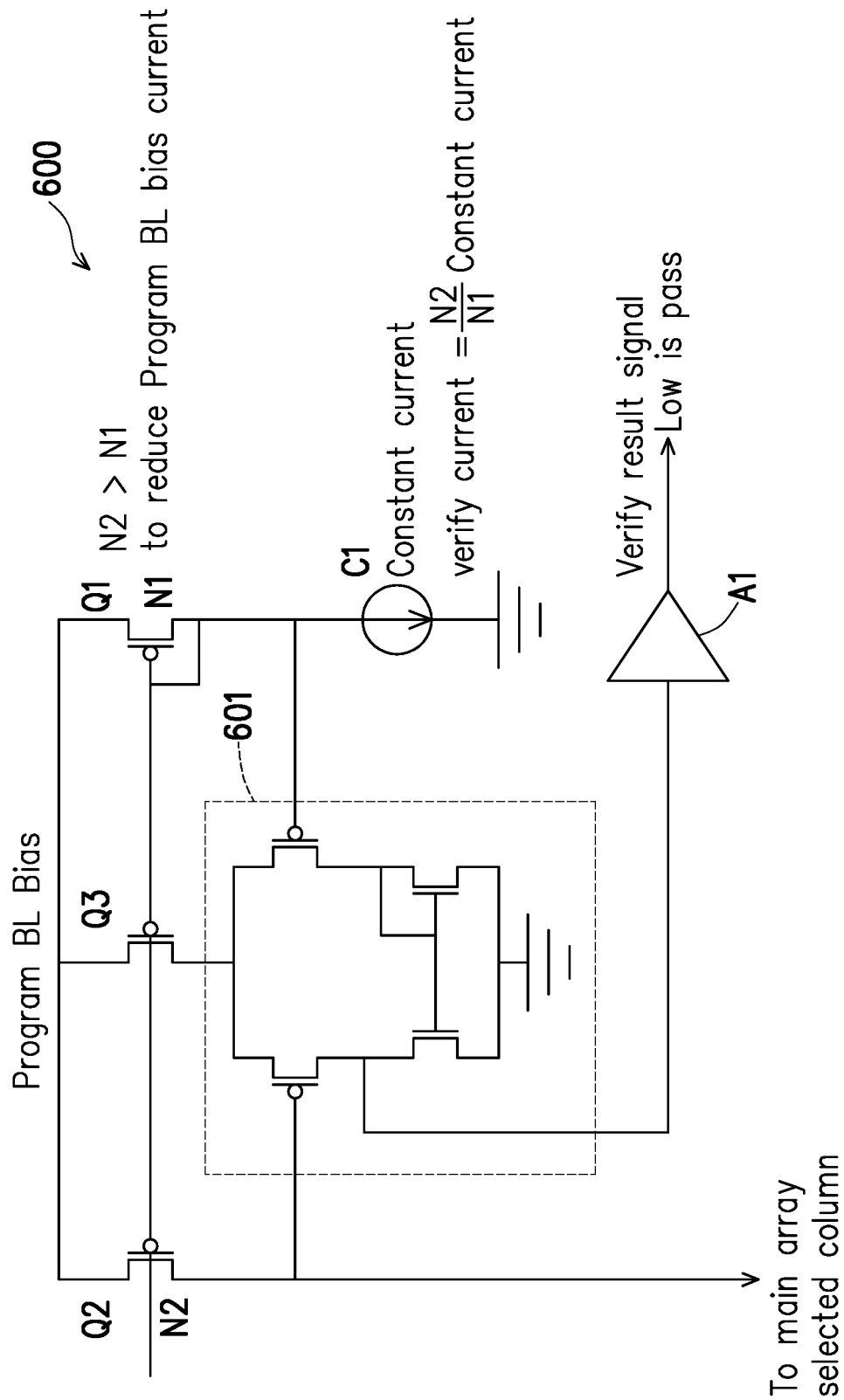
FIG. 6 illustrates a leakage current verifying circuit according to an exemplary embodiment of the disclosure.

FIG. 6 shows a (partial) leakage current verifying circuit 600 for verifying the leakage current of a single memory cell. The leakage current verifying circuit 600 for a single memory cell would include not limited to a sense amplifier circuit 601 and a current mirror circuit which includes the Q1 transistor, the Q2 transistor, and the Q3 transistor. The channel width N2 of the Q2 transistor could be greater than the channel width N1 of the Q1 transistor so as the reduce the BL bias current during a program operation. The previously described a positive BL voltage (e.g. 4V) could be applied to the source terminal of each of the transistors Q1 Q2 Q3 of the current mirror circuit. The drain terminal of the Q2 transistor is connected a selected column of a memory array (e.g. 101 201), and the drain terminal of the Q1 transistor is connected to a constant reference current source C1 having a reference current of N2/N1. The reference current is used as the leakage current threshold and the sense amplifier 601 circuit would function as a comparator to compare the leakage current of the memory cell to the reference current (i.e. leakage current threshold). The sense amplifier 601 circuit would output the result of the comparison as a comparison signal to the first buffer amplifier A1. If the leakage current of the memory cell is lower than the reference current, the comparison signal which is output from the first buffer amplifier A1 could indicate a low voltage. If the leakage current of the memory cell is higher than the reference current, the comparison signal which is output from the first buffer amplifier A1 could indicate a high voltage.

Figure 7:
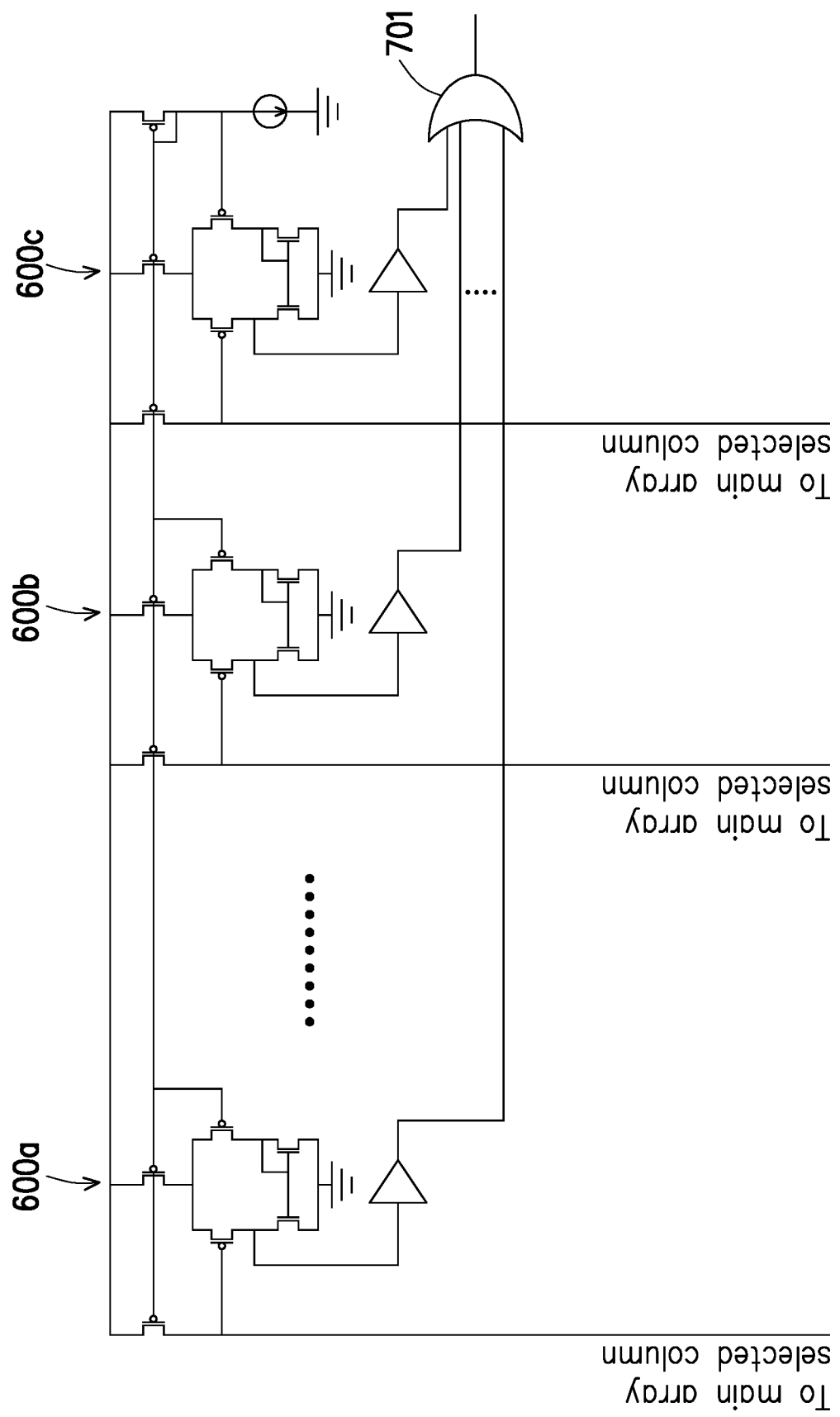
FIG. 7 illustrates a leakage current verifying circuit for a column of memory cells according to an exemplary embodiment of the disclosure.
Figure 8:
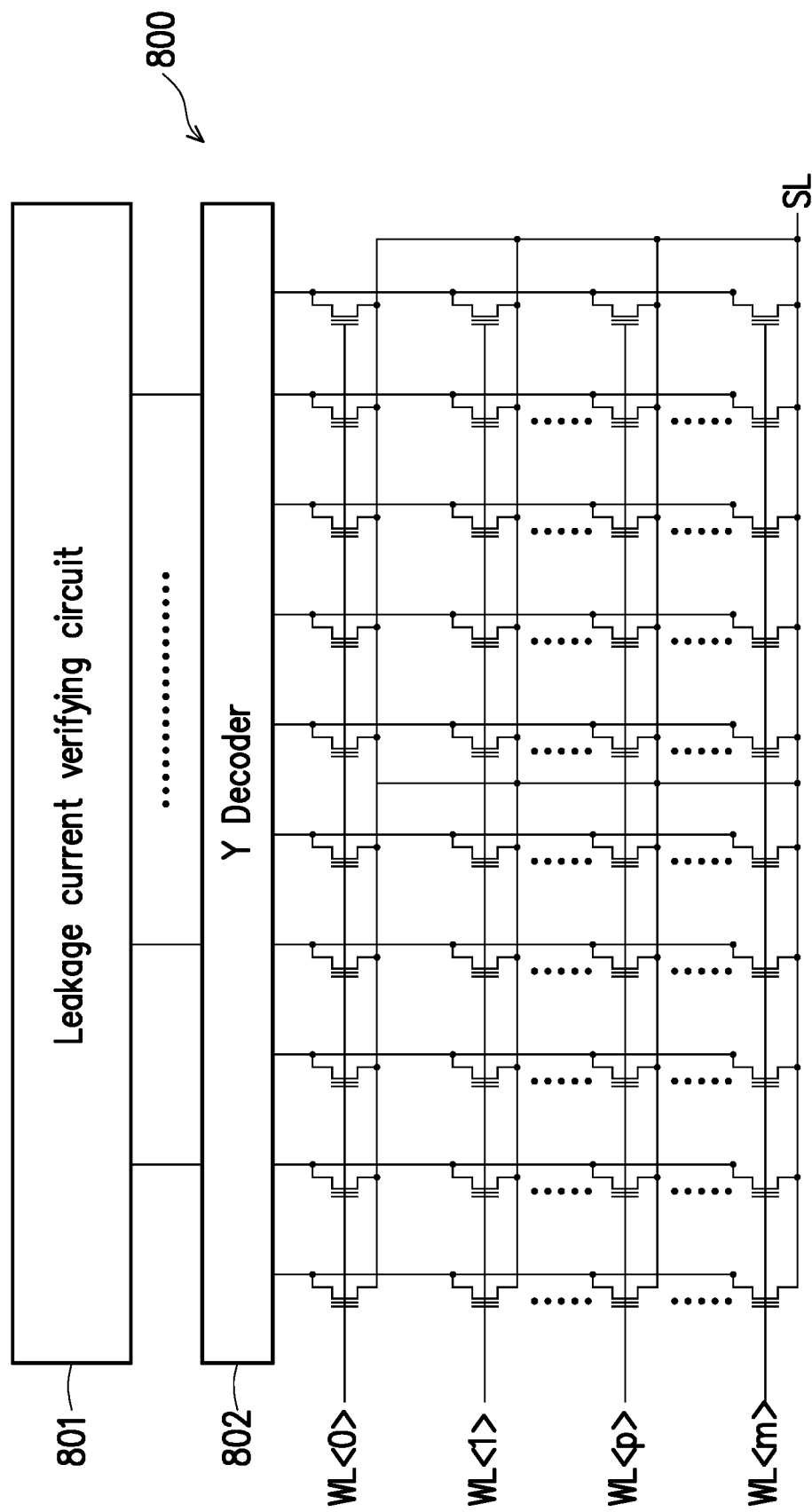
FIG. 8 illustrates a leakage current verifying circuit connected to memory cells according to an exemplary embodiment of the disclosure.

FIG. 7 shows an array of single cell leakage current verifying circuit (e.g. 600) forming a plurality of single cell leakage current verifying circuits (e.g. 600a 600b 600c) for verifying the leakage current of a column of memory cells. Each of the plurality of single cell leakage current verifying circuits (e.g. 600a 600b 600c) would output a comparison signal to an OR gate 701 which performs a logical OR operation. If any of the plurality of single cell leakage current verifying circuits (e.g. 600a 600b 600c) outputs a high signal, the OR gate 701 would output a high signal indicating that the selected column of memory cells has failed the leakage current verifying operation. If all of the plurality of single cell leakage current verifying circuits (e.g. 600a 600b 600c) outputs a low signal, the OR gate 701 would output a low signal indicating that the selected column of memory cells has passed the leakage current verifying operation.

The leakage current verifying circuit 801 could be connected to a memory array (e.g. 101 201) through a Y decoder 802. The Y decoder 802 is connected to BLs of the memory array (e.g. 101 201), and thus a BL of the memory array (e.g. 101 201) could be selected by the Y decoder 802. Also, each column of memory array could be controlled by a different WL (e.g. WL<0> WL<1> WL<p> WL<m>). Therefore, the controller (e.g. 102 202) would be able to facilitate the leakage current verifying circuit 801 to access a particular memory cell location by activating a particular WL for selecting a column and by inputting a selection signal into the Y decoder 802 for selecting a BL.

Figure 9:
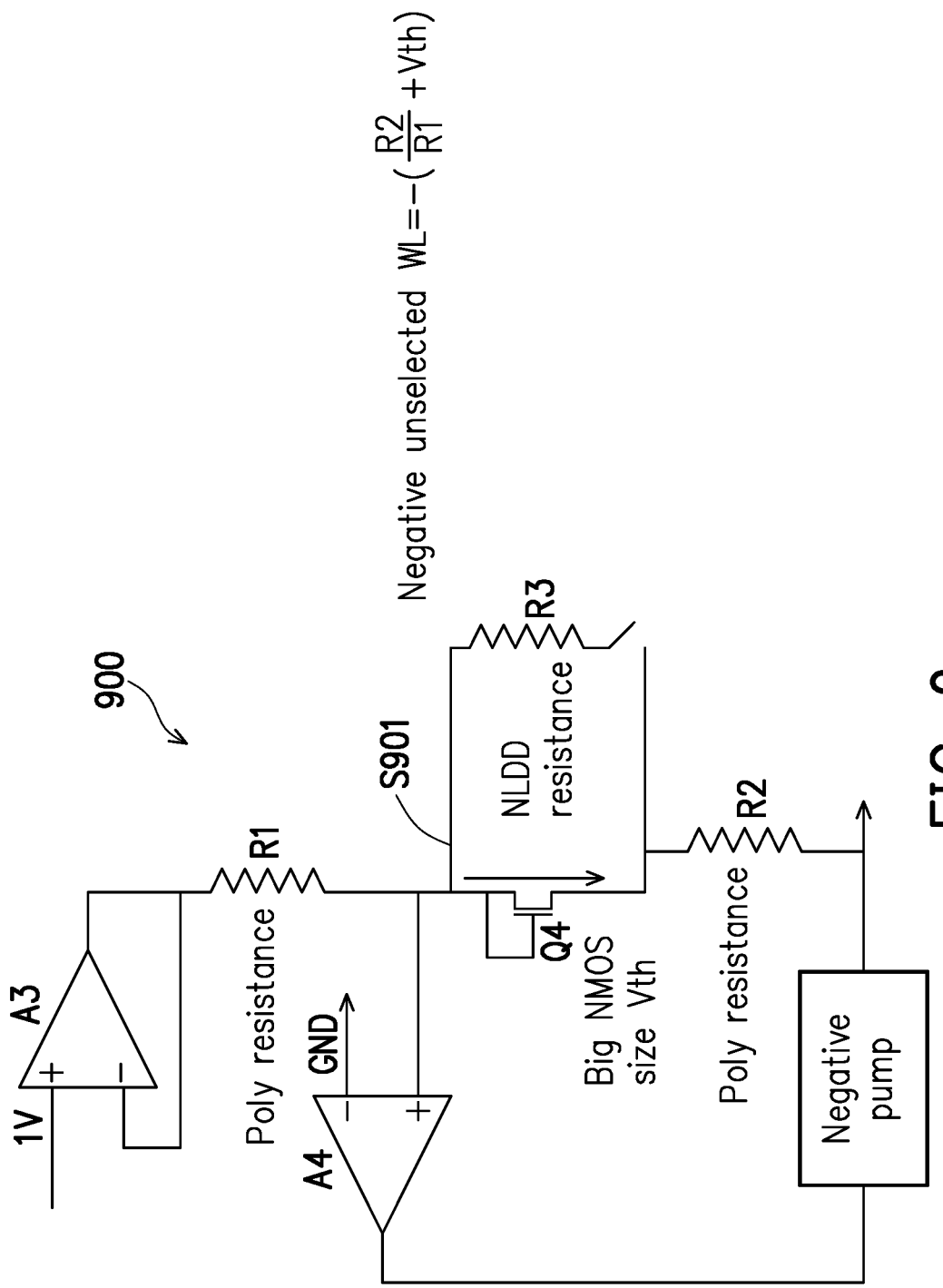
FIG. 9 illustrates a WL voltage regulator for a post program verify operation for the first exemplary embodiment according to an exemplary embodiment of the disclosure.

The disclosure also provides a WL voltage regulating circuit for unselected WLs for the memory device 100 of the first exemplary embodiment and the memory device 200 of the second exemplary embodiment. It has been observed that the leakage current may increase with temperature, and therefore a WL voltage regulating circuit would assist regulating the negative voltages of unselected WLs. FIG. 9 shows such a WL voltage regulating circuit 900 for a post program verify operation for the memory device 100 of the first exemplary embodiment. The voltage regulating circuit 900 would include not limited to a first resistor R1, a second resistor R2, a third resistor R3, a voltage follower amplifier A3, a comparator amplifier A4, a negative voltage charge pump, and a NMOS transistor Q4. A first terminal of the first resistor R1 is connected to the voltage follower amplifier A3, and a second terminal of the first resistor R1 is connected to the comparator amplifier A4, the NMOS transistor Q4, and the third resistor R3. A first terminal of the second resistor R2 is connected to the negative voltage charge pump, and a second terminal of the second resistor R2 is connected to the NMOS transistor Q4 and the third resistor R3. The third resistor R3 is connected in parallel with the NMOS transistor Q4 and the first and the second terminals of the third resistor R3 are connected to the second terminal of the first resistor R1 and the first terminal of the second resistor R2 respectively.

The second terminal of the second resistor R2 is connected to a WL of a column of memory cells and thus may output a regulated negative voltage to unselected WLs during a post program verify operation. Based on the circuit configuration of FIG. 9, the negative voltage at the second terminal of the second resistor R2 is regulated according to $-(R2/R1+Vth)$ where Vth is the threshold voltage of the NMOS transistor Q4. As the temperature gets higher, the threshold voltage Vth of the NMOS transistor Q4 would get smaller to compensate for the rising temperature so that the negative voltage at the second terminal of the second resistor R2 would be less negative as the temperature rises. Also, as the temperature rises, less current would flow through the NMOS transistor Q4 resulting in the less negative voltage at the second terminal of the second resistor R2. In general, for the post program verify operation, the absolute value of the negative voltage at the second terminal of the second resistor R2 at a hotter temperature would be less than the absolute value of the negative voltage at the second terminal of the second resistor R2 at a colder temperature.

Figure 10:
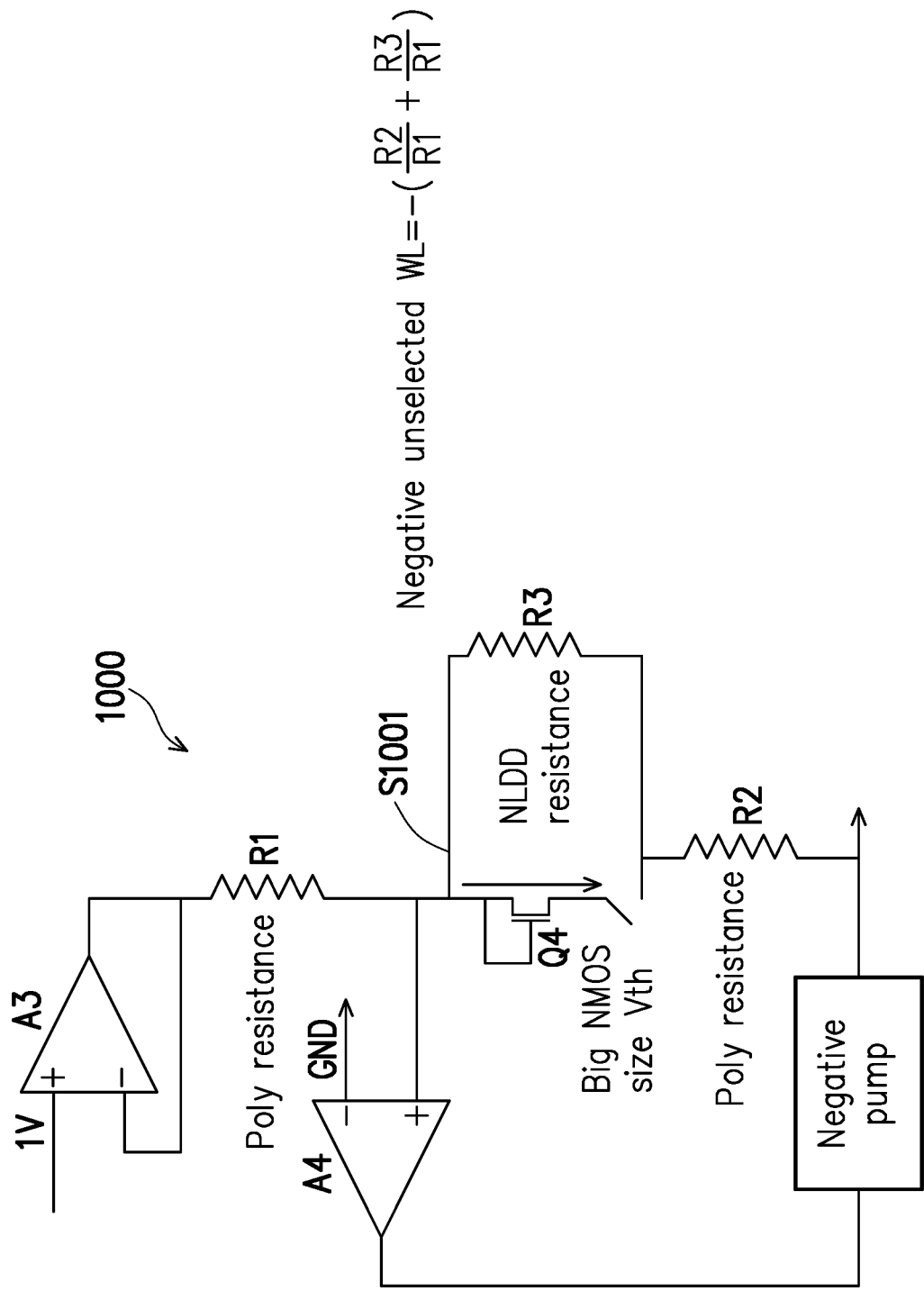
FIGS. 10 and 11 illustrates WL voltage regulators for a program operation for the first and second exemplary embodiment according to an exemplary embodiments of the disclosure respectively.

FIG. 10 shows such a WL voltage regulating circuit 1000 for a program write operation for the memory device 100 of the first exemplary embodiment. The circuit components of the WL voltage regulating circuit 1000 is similar to the WL voltage regulating circuit 900 of FIG. 9. However, the negative voltage at the second terminal of the second resistor R2 is regulated according to $-((R2/R1)+(R3/R1))$ where the first resistor R1 and the second resistor R1 have high doping resistances and thus their resistances are less affected by temperature variations while R3 has a light doping resistance and thus the resistance of the third resistor R3 is higher at a higher temperature. Therefore, as the temperature rises, less current would flow through the third resistor R3 resulting in the greater negative voltage at the second terminal of the second resistor R2. Thus, for the post write operation, the absolute value of the negative voltage at the second terminal of the second resistor R2 at a hotter temperature would be greater than the absolute value of the negative voltage at the second terminal of the second resistor R2 at a colder temperature.

Figure 11:
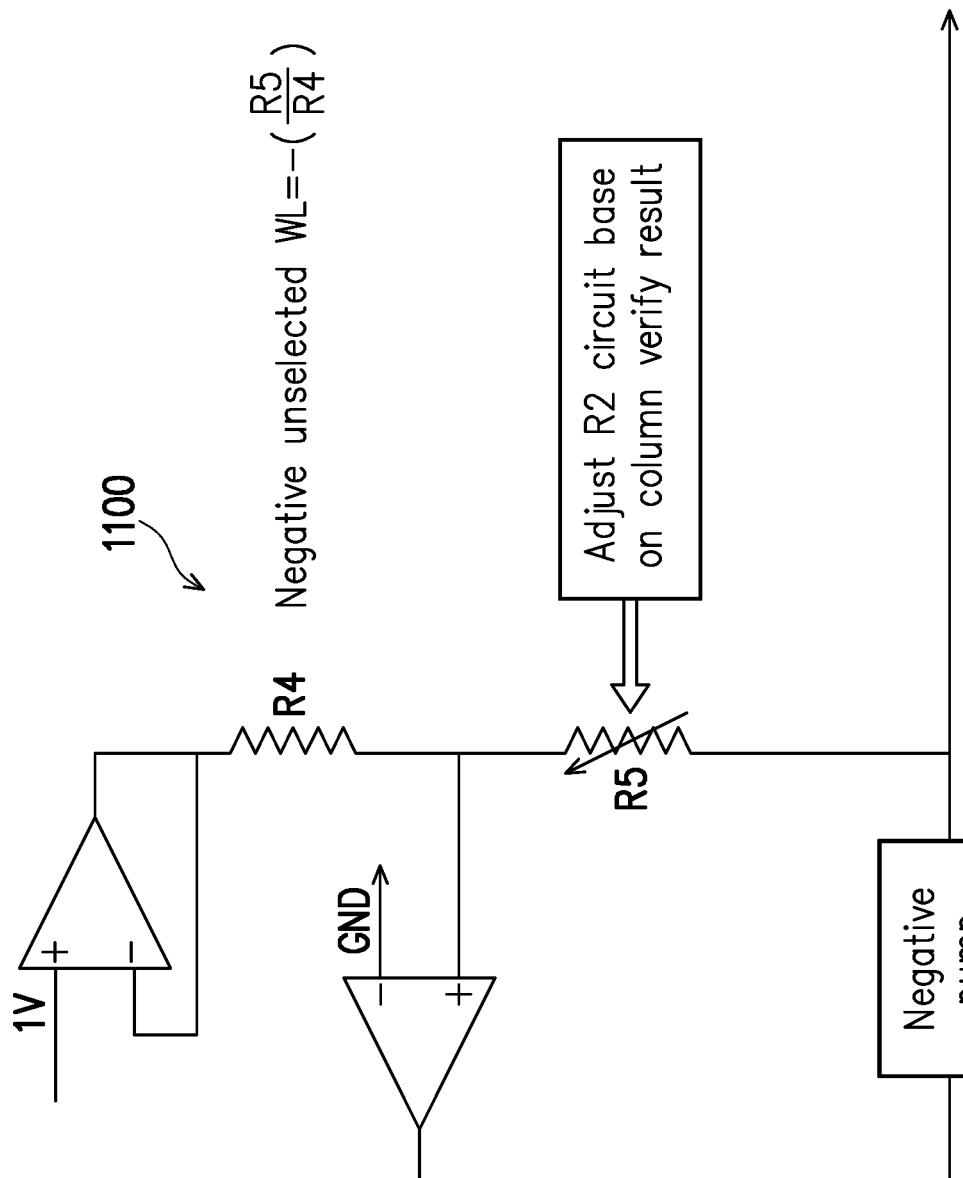

The WL voltage regulating circuit 1100 for a program write operation for memory device 200 of the second exemplary embodiment is shown in FIG. 11. The WL voltage regulating circuit 1100 is similar to the WL voltage regulating circuit 900 1000 of the first exemplary embodiment except for the absence of the NMOS transistor Q4 and the third resistor R3. The reason for the difference is that, for the program write operation, there is no need to consider the impact of the temperature on the leakage current. However, the negative voltage at the second terminal of the second resistor R2 is regulated according to $-(R2/R1)$ where the second resistor R2 is an adjustable resistor and is used for adjusting the negative voltage for the negative voltage sweep for step S403.

In view of the aforementioned descriptions, the disclosure provides a memory device with a mechanism for minimizing the leakage current of the memory device. The disclosure is suitable for being used by a flash memory device and the like so as to improve the overall performance and to decrease the power consumption of the memory device.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A memory device comprising:
   a memory array comprising a group of memory cells which comprises M word lines (WLs) and N bit lines as M and N are integers greater than 1;
   a leakage current verifying circuit for verifying leakage currents of the memory array; and
   a controller coupled to the memory array and the leakage current verifying circuit and configured at least to:
   initiate a program operation for a first column of memory cells which belongs to the group of memory cells and is connected to a first WL of the M WLs;
   set a verify condition which comprises a leakage current threshold during a leakage current verifying operation;
   perform, via the leakage current verifying circuit, a leakage current verifying operation for the first column of the memory cells by applying a negative voltage sweep to each of first remaining M−1 unselected WLs of the M WLs until finding a first negative voltage resulting in the first column of the memory cells having passed leakage current threshold;
   apply the program operation for the first column of the memory cells by applying the first negative voltage to each of the first remaining M−1 unselected WLs of the M WLs and a positive bit line voltage for the N BLs;
   determine whether a first address corresponding to the first column of the memory cells is a final address;
   initiate the program operation for a second column of memory cells which belongs to the group of memory cells and is connected to a second WL of the M WLs in response to the first address not being the final address;
   select the second WL of the M WLs corresponding to the second column of the memory cells;
   apply another negative voltage sweep to each of a second remaining M−1 unselected WLs of the M WLs until finding a second negative voltage resulting in the second column of the memory cells passing the leakage current threshold, wherein the first negative voltage is different from the second negative voltage;
   apply the program operation for the second column of the memory cells while applying the second negative voltage to each of the second remaining M−1 unselected WLs of the M WLs;
   apply a negative voltage for the first remaining M−1 unselected WLs of the M WLs;
   determine whether the first column of the memory cells passes the leakage current threshold;
   in response to the first column of the memory cells passing the leakage current threshold, selecting the negative voltage as the first negative voltage; and
   in response to the first column of the memory cells not passing the leakage current threshold, keep decreasing the negative voltage until the first column of the memory cells passes the leakage current threshold, wherein the leakage current verify circuit comprises:
   a sense amplifier circuit configured to compare a leakage current of the cell of the first column of the memory cells to a reference current source which serves as the leakage current threshold, and
   a buffer amplifier configured to transmit a binary signal which indicates either the passing of the first column of the memory cells or the failure of the first column of the memory cells.

2. The memory device of claim 1, wherein the leakage current verify circuit further comprises:
   an OR gate connected to each cell of the first column of the memory cells for indicating whether any cell of the first column of memory cells has failed the leakage current verifying operation.

3. The memory device of claim 1, wherein the leakage current verify circuit further comprises a WL voltage regulating circuit for regulating a negative voltage for each of the first remaining M−1 unselected WLs.

4. The memory device of claim 3, wherein the WL voltage regulating circuit comprises:
a first resistor (R1) receiving a constant voltage from a buffer amplifier; and
an adjustable second resistor (R2) connected to the R1 in series and a WL of the M WLs.

5. The memory device of claim 3, wherein the negative voltage for each of the first remaining M−1 unselected WLs is regulated according to −(R2/R1).

6. The memory device of claim 3, wherein the WL voltage regulating circuit further comprises:
a third resistor (R3);
a voltage follower amplifier;
a comparator amplifier; and
a N type transistor.

7. The memory device of claim 6, wherein a first terminal of the first resistor is connected to the voltage follower amplifier, and a second terminal of the first resistor is connected to the comparator amplifier, the N type transistor, and the third resistor.

8. The memory device of claim 7, wherein a first terminal of the second resistor is connected to a negative voltage charge pump, and a second terminal of the second resistor is connected to the N type transistor and the third resistor.

9. The memory device of claim 8, wherein the second terminal of the second resistor is connected to the WLs of memory cells and thus may output a regulated negative voltage to unselected WLs during a post program verify operation.

10. The memory device of claim 9, wherein a regulated negative voltage at the second terminal of the second resistor is regulated according to −(R2/R1+Vth) where Vth is a threshold voltage of the N type transistor.

11. The memory device of claim 10, wherein higher temperature causes Vth to decrease so as to cause the regulated negative voltage to decrease.

12. The memory device of claim 11, wherein higher temperature causes less current to flow through the N type transistor so as to cause the second terminal of the second resistor to output a lesser regulated negative voltage.

13. The memory device of claim 11, wherein the regulated negative voltage at the second terminal of the second resistor is regulated according to −((R2/R1)+(R3/R1)).

14. The memory device of claim 13, wherein R1 and R2 have higher doping resistances than R3.

15. The memory device of claim 7, wherein the third resistor is connected in parallel with the N type transistor, and the first and the second terminals of the third resistor are connected to the second terminal of the first resistor and the first terminal of the second resistor respectively.

* * * * *